United States Patent [19]

Yamada et al.

[11] Patent Number: 5,073,874
[45] Date of Patent: * Dec. 17, 1991

[54] METHOD OF AND APPARATUS FOR REDUCING CURRENT OF SEMICONDUCTOR MEMORY DEVICE

[75] Inventors: Michihiro Yamada; Hiroshi Miyamoto, both of Hyogo, Japan

[73] Assignee: Mitsubishi Denki Kabushiki Kaisha, Tokyo, Japan

[*] Notice: The portion of the term of this patent subsequent to Jun. 12, 2007 has been disclaimed.

[21] Appl. No.: 417,127

[22] Filed: Oct. 4, 1989

Related U.S. Application Data

[63] Continuation of Ser. No. 223,693, Jul. 22, 1988, Pat. No. 4,933,902.

[30] Foreign Application Priority Data

Jul. 23, 1987 [JP] Japan .................................. 62-185297

[51] Int. Cl.$^5$ ....................... G11C 11/406; G11C 5/14
[52] U.S. Cl. ...................................... 365/226; 365/227; 365/193; 365/194; 365/189.08; 307/272.3
[58] Field of Search ................ 365/228, 229, 189.07, 365/193, 194, 195, 196, 226, 227; 307/272.3

[56] References Cited

U.S. PATENT DOCUMENTS

| | | | |
|---|---|---|---|
| 3,562,555 | 9/1967 | Ahrons | 307/296.4 |
| 4,174,541 | 1/1979 | Schmitz | 365/229 X |
| 4,216,389 | 8/1980 | Carter | 307/272.3 |
| 4,398,102 | 8/1983 | Stewart | 365/195 X |
| 4,409,501 | 10/1983 | Eikerman et al. | 307/272.3 |
| 4,422,163 | 12/1983 | Oldenkamp | 365/229 |
| 4,451,742 | 5/1981 | Aswell | 365/229 |
| 4,578,774 | 3/1986 | Muller | 365/195 X |
| 4,654,829 | 12/1984 | Jiang et al. | 365/229 |
| 4,712,196 | 10/1985 | Uesugi | 307/66 |
| 4,777,626 | 10/1988 | Matsushita et al. | 365/226 |
| 4,788,454 | 11/1988 | Tanagawa et al. | 307/272.3 |
| 4,849,654 | 7/1987 | Okada | 307/272.3 X |
| 4,864,541 | 9/1989 | Marquot | 365/195 X |
| 4,874,965 | 10/1989 | Compardo et al. | 307/272.3 |
| 4,886,984 | 12/1989 | Nakaoka | 307/272.3 |
| 4,900,950 | 2/1990 | Dubujet | 307/272.3 |

OTHER PUBLICATIONS

"A Reliable 1-Mbit DRAM with a Multi-Bit-Test Mode" by M. Kumanoya et al., IEEE Journal for Solid-State Circuits, vol. SC 20, No. 5 (Oct. 1985) pp. 909-913.
"A Fast 256KX4 CMOS DRAM with a Distributed Sense and Unique Restore Circuit" by H. Miyamoto et al., IEEE Journal of Solid-State Circuits, vol. SC 22, No. 5 (Oct. 1987) pp. 861-867.
"Principles of CMOS VLSI Design, A Systems Perspective", by N. Weste et al., Addison-Wesley Publishing Co., 1985, pp. 227-229.

Primary Examiner—Alyssa H. Bowler
Attorney, Agent, or Firm—Lowe, Price, LeBlanc, & Becker

[57] ABSTRACT

A clock generator circuit of a dynamic RAM comprises a power-on reset circuit and an NOR gate connected to a $\overline{RAS}$ terminal and the reset circuit. In operation, the powre-on reset circuit generates a one-shot pulse immediately after the power supply is turned on. During a period of a pulse width of the one-shot pulse, this clock generator circuit operates as if it receives a high-level $\overline{RAS}$ signal and, as a result, it is possible to reduce an excessive current flowing into the dynamic RAM at the time of turning on the power supply.

56 Claims, 9 Drawing Sheets

METHOD OF AND APPARATUS FOR REDUCING CURRENT OF SEMICONDUCTOR MEMORY DEVICE

This is a continuation, division, of application Ser. No. 07/223,693 now U.S. Pat. No. 4,933,902.

BACKGROUND OF THE INVENTION

1. Field of the Invention

The present invention relates generally to semiconductor memory devices, and more particularly, a method of and an apparatus for reducing current flow from a power supply into a memory device immediately after the power supply is turned on.

2. Description of the Prior Art

Figure 1:
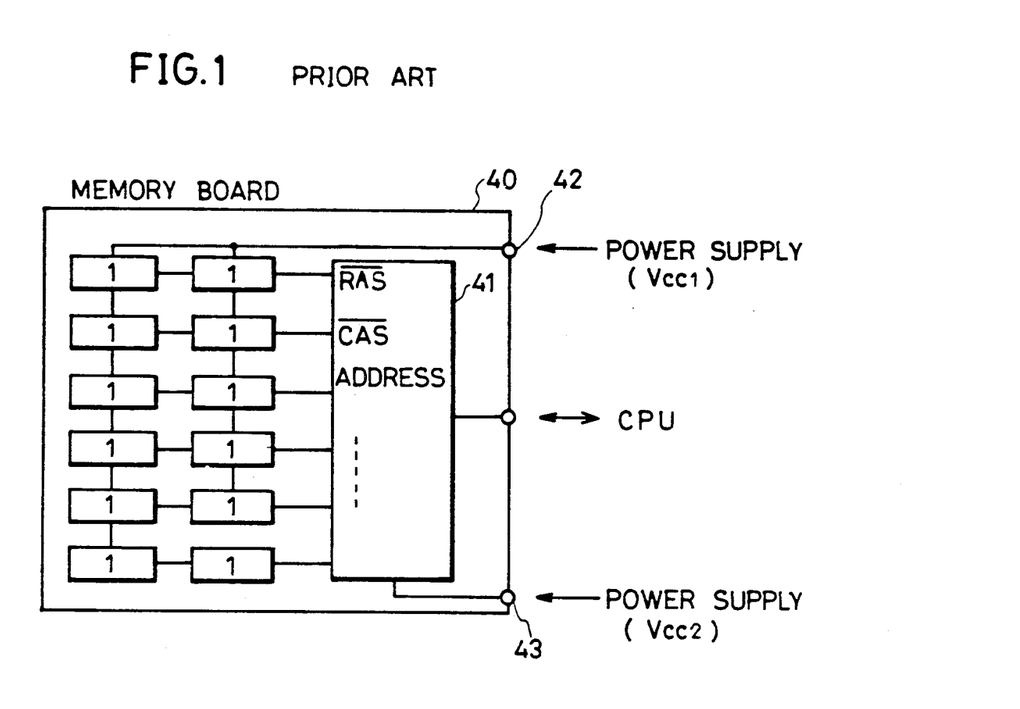
FIG. 1 is a block diagram showing a memory board employed in apparatuses utilizing computers.

FIG. 1 is a block diagram showing a memory board generally employed in apparatuses utilizing computers. Referring to FIG. 1, the memory board 40 comprises a number of memory chips 1 for storing data signals and a control circuit 41 for controlling the memory chip 1. The memory chip 1 is connected to receive voltage from an external power supply $Vcc_1$ through a terminal 42 and the control circuit 41 is connected to receive a voltage from another external power supply $Vcc_2$ through a terminal 43. The control circuit 41 generates a $\overline{RAS}$ (Row Address Strobe) signal, a $\overline{CAS}$ (Column Address Strobe) signal and address signals, and controls reading/writing of the memory chip 1 based on instructions from a CPU (Central Processing Unit).

In order to supply power to the memory chip 1 and the control circuit 41, different power supplies $Vcc_1$ and $Vcc_2$ such as shown in FIG. 1 are utilized, or a common power supply is utilized. For example, if a backup power supply for a memory chip 1 is used, two different supply voltages are applied. In either case, the level (high or low) of the $\overline{RAS}$ signal applied to the memory chip 1 depend on the system when the power is turned on.

Figure 2:
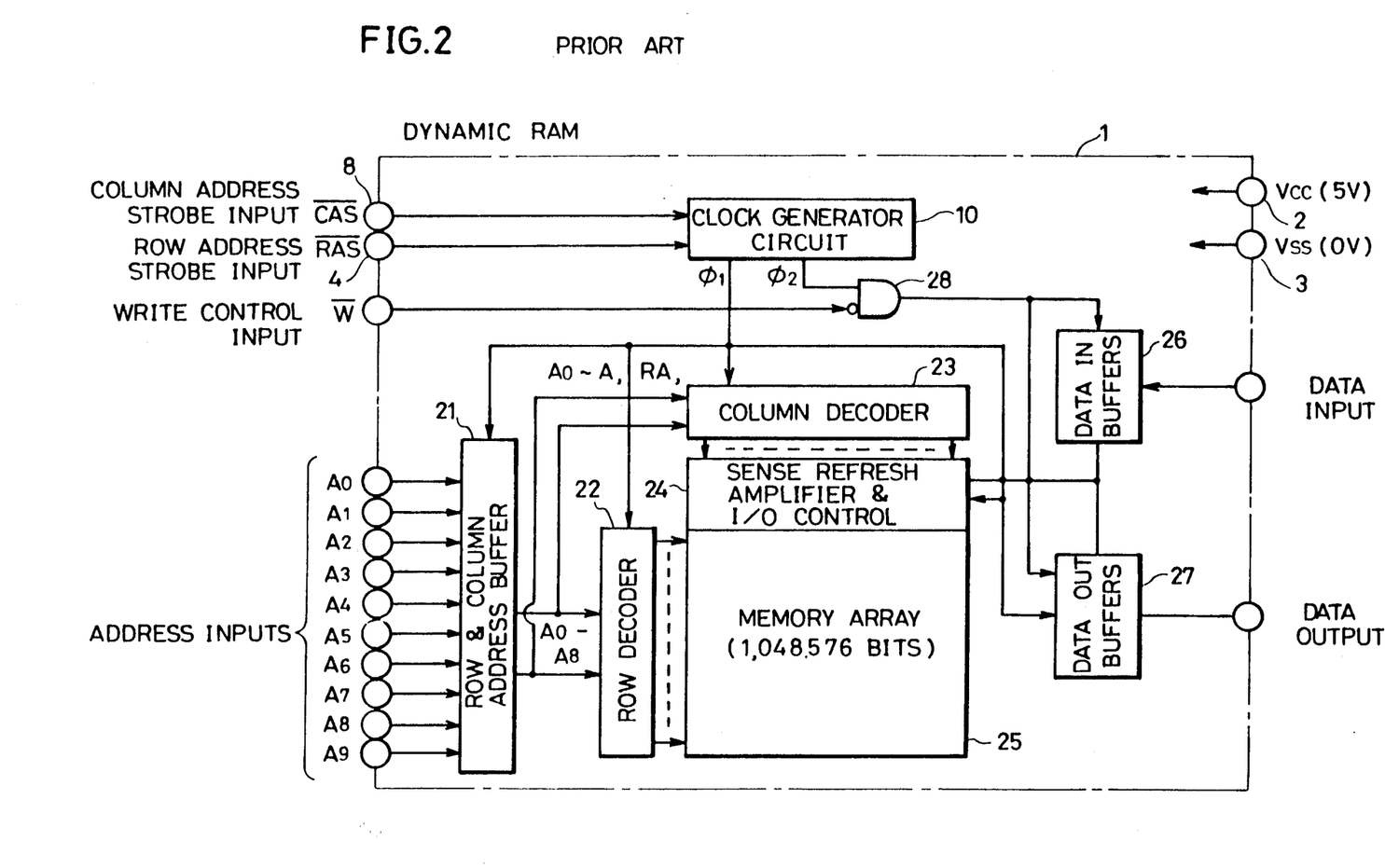
FIG. 2 is a block diagram showing the conventional 1 M-bit dynamic RAM.

FIG. 2 is a block diagram showing a conventional 1 M-bit dynamic RAM (Random Access Memory Device). The dynamic RAM such as shown in FIG. 1 is disclosed in "A reliable 1-M bit DRAM with a multi-bit-test mode" by M. Kumanoya et al., 1985 (IEEE Journal Solid-State Circuits, vol. SC-20, pp. 909-913) and also in "A Fast 256K×4 CMOS DRAM with a Distributed Sense and Unique Restore Circuits" by H. Miyamoto et al., 1987 (IEEE Journal Solid-State Circuits, vol. SC-22, pp. 861-867).

Referring to FIG. 2, the dynamic RAM comprises a clock generator circuit 10 for outputting clock signals $\phi_1$ and $\phi_2$ which control this dynamic RAM in response to a $\overline{CAS}$ signal and a $\overline{RAS}$ signal. The $\overline{CAS}$ signal and the $\overline{RAS}$ signal are externally applied through a $\overline{CAS}$ terminal 8 and a $\overline{RAS}$ terminal 4, respectively. A power supply Vcc (5 V) and the ground Vss (0 V) are externally applied through a power supply terminal 2 and a ground terminal 3, respectively.

Figure 3:
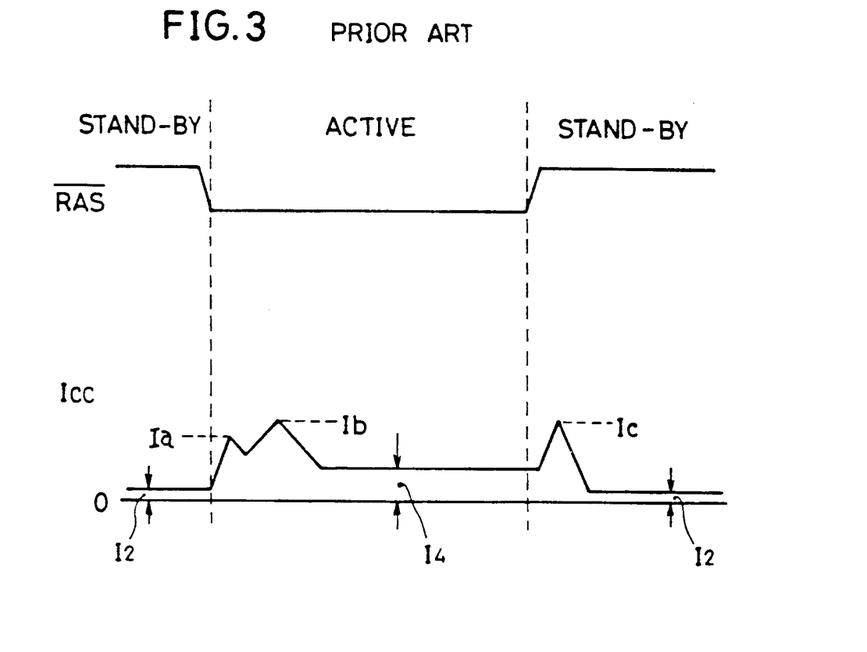
FIG. 3 is a timing chart showing the change of current to be consumed in a dynamic RAM.

FIG. 3 is a timing chart showing the change of the current to be consumed in the dynamic RAM. Referring to FIG. 3, the dynamic RAM has two states of operation, that is, standby state and active state. The dynamic RAM is brought to the standby state when a high level $\overline{RAS}$ signal is applied, while it is brought to the active state when a low level $\overline{RAS}$ signal is applied. As is apparent from the figure, the current Icc to be consumed flowing from the power supply Vcc shown in FIG. 2) changes dependent on the state of operation of the dynamic RAM.

In the standby state, an approximately constant current $I_2$ of about 1–3 mA flows from the power supply Vcc to the dynamic RAM. (The reason for this will be described later.)

Immediately after the change of the $\overline{RAS}$ signal from high level to low level, the dynamic RAM is brought to the active state and a transient current $I_a$ flows. The current $I_a$ mainly comprises a charging current for activating the clock generator circuit 10 and an operating current for operating the row address buffer 21 and the row decoder 22 in FIG. 2. After 30–50n sec from the change of the $\overline{RAS}$ signal to the low level, a transient current $I_b$ flows. The current $I_b$ is consumed by the sense amplifier 24 to charge bit lines in the memory array 25. The bit line charging operation by the sense amplifier 24 in the active state will be described in detail later.

When the current $I_b$ is decreased, a constant current $I_4$ flows to activate the data output buffer 27. The current $I_4$ is less than 10 mA in a normal state.

Thereafter, immediately after the change of the $\overline{RAS}$ signal from the low level to the high level, the dynamic RAM returns to the standby state and a transient current $I_c$ flows. The current $I_c$ mainly comprises a current for bringing the clock generator circuit 10 to the standby state and a current for bringing the row address buffer 21 and the row decoder 22 to the standby state.

Figure 4:
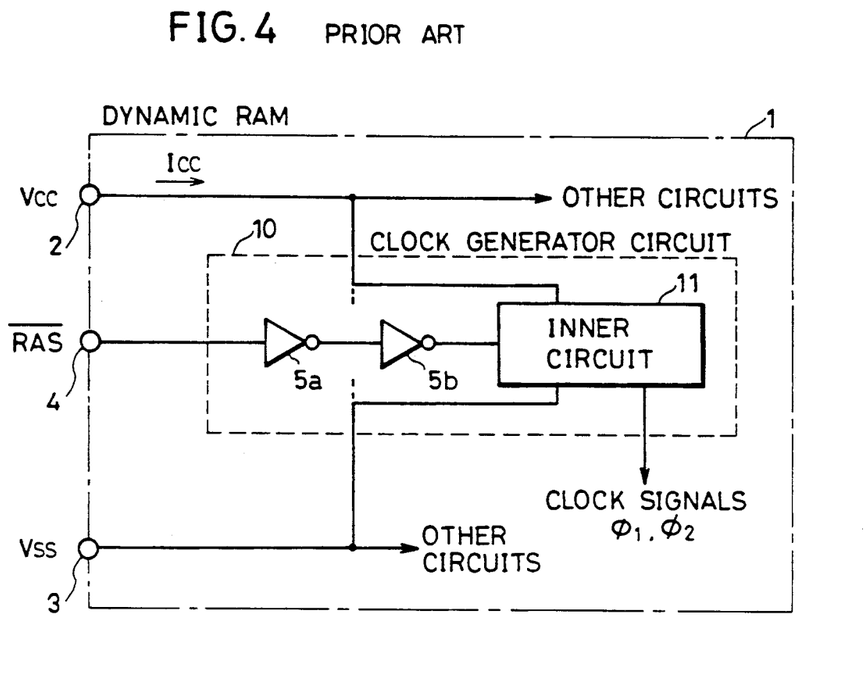
FIG. 4 is a schematic diagram showing the conventional clock generator circuit of the dynamic RAM of FIG. 2.

FIG. 4 is a schematic diagram showing the clock generator circuit of the dynamic RAM in FIG. 2. Referring to FIG. 4, the clock generator circuit 10 comprises a buffer circuit connected to a $\overline{RAS}$ terminal 4 and a inner circuit 11 connected between a power supply Vcc and the ground Vss for outputting clock signals $\phi_1$ and $\phi_2$ in response to a signal from the buffer circuit. The buffer circuit comprises two inverters 5a and 5b connected in series. A reference character Icc represents consumed current flowing from the power supply Vcc to a dynamic RAM 1.

In general, for a circuit receiving an input signal from the outside, a buffer circuit connected to an input terminal comprises inverters. For example, a buffer circuit employing inverters is described by Neil H. E. Weste et al. in "PRINCIPLES OF CMOS VLSI DESIGN", pp. 227-229, published by ADDISON-WESLEY PUBLISHING COMPANY in 1985.

A description is made of operation which occurs when the supply voltage. Vcc is externally applied to the dynamic RAM in FIG. 4.

Figure 5:
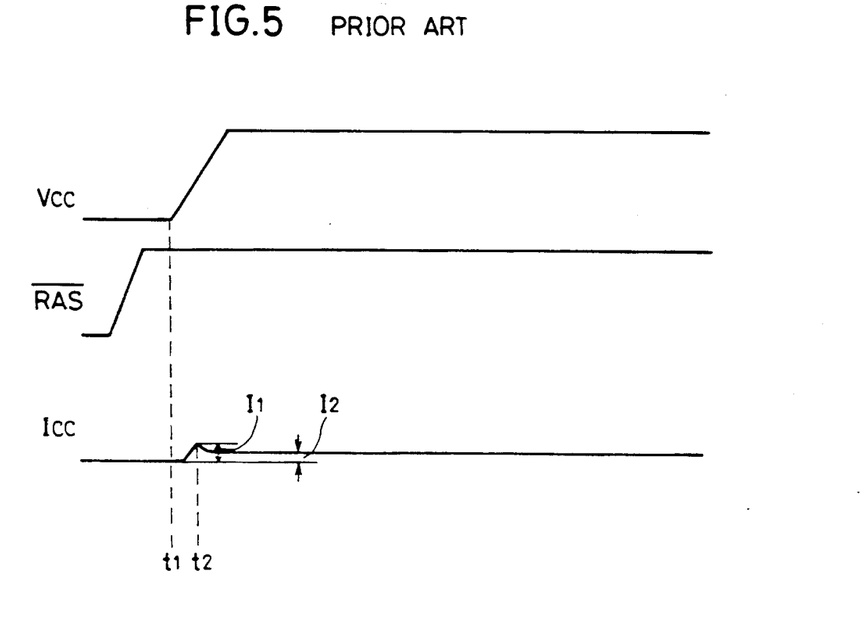
FIGS. 5 and 6 ar timing charts for explaining operation of the dynamic RAM in FIG. 4.
Figure 6:
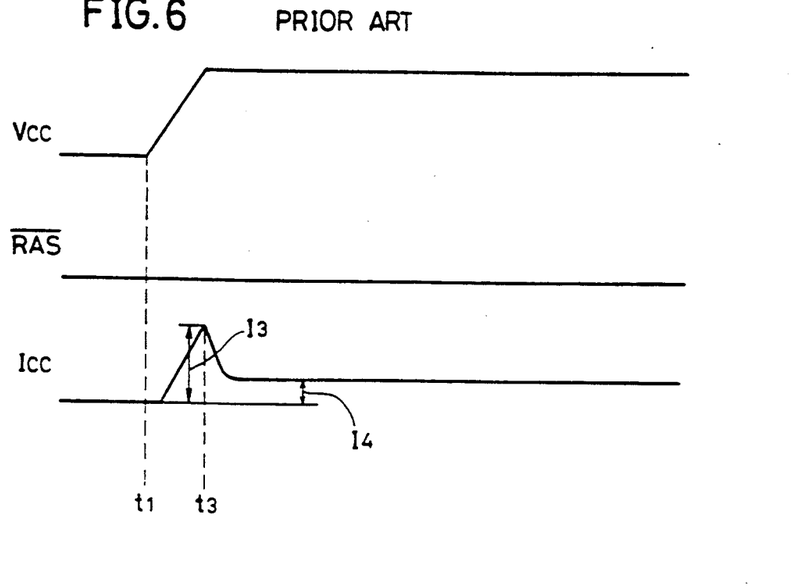

FIGS. 5 and 6 are timing charts showing a change of signals for explaining the operation of the dynamic. RAM in FIG. 4. Referring to FIGS. 5 and 6, the supply voltage Vcc starts to be applied to the terminal 2 from a time $t_1$ and the applied voltage rises up to a predetermined voltage level. When the applied voltage reaches the predetermined voltage level, it will not change thereafter.

FIG. 5 shows the case in which a high-level $\overline{RAS}$ signal is applied to the $\overline{RAS}$ terminal 4 before the time $t_1$. The dynamic RAM is in the standby state when the $\overline{RAS}$ signal is at high level and it is in the active state when the $\overline{RAS}$ signal is at low level. Power consumption is small when the dynamic RAM is in the standby state and it is large when the dynamic RAM is in the active state. Therefore, the supply voltage Vcc (for example 5V) is applied to the dynamic RAM while the dynamic RAM is in the standby state in FIG. 5. As a result, after the current Icc flowing into the dynamic RAM reaches its small peak value of $I_1$ (several mA) at a time $t_2$, the value is reduced to $I_2$ which is smaller than $I_1$, and then stabilized. The value of $I_2$ is a current value necessary for operation in the standby state. The reason why these different values flow will be described in the following.

Figure 7:
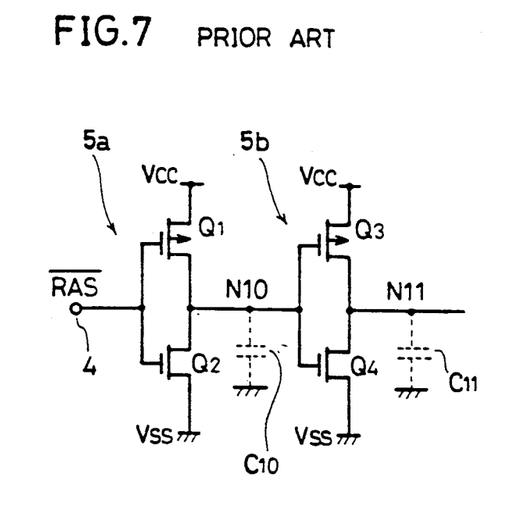
FIG. 7 is a schematic diagram showing a buffer circuit in the clock generator circuit shown in FIG. 4.

FIG. 7 is a schematic diagram showing a buffer circuit in the clock generator circuit 10 shown in FIG. 4. Referring to FIG. 7, the buffer circuit comprises two inverters 5a and 6a. The inverter 5a comprises a series connection of a P channel MOS transistor Q1 and an N channel MOS transistor Q2 connected between the power supply Vcc and the ground Vss. The gates of the transistors Q1 and Q2 are connected together and the $\overline{RAS}$ signal is applied thereto. The inverter 5b also comprises a P channel MOS transistor Q3 and an N channel MOS transistor Q4 connected in a similar manner as the inverter 5a. The gates of the transistors Q3 and Q4 are connected together to the output of the inverter 5a. A stray capacitance C10 exists between the output node N10 of the inverter 5a and the ground Vss, and a stray capacitance C11 exists between the output node N11 of the inverter 5b and the ground Vss.

Figure 8:
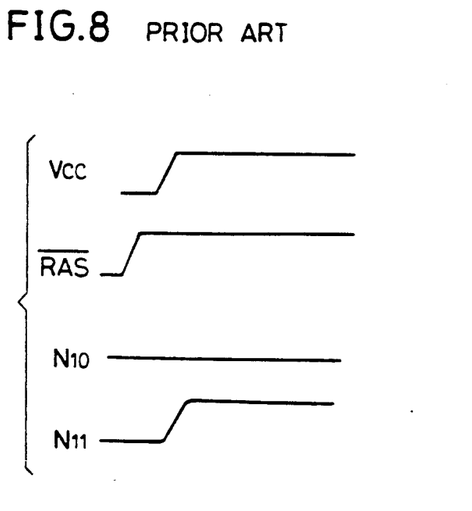
FIG. 8 is a timing chart for illustrating the operation of the buffer circuit shown in FIG. 7.

FIG. 8 is a timing chart showing the change of the voltage at output nodes of two inverters shown in FIG. 7 when the power supply Vcc rises. Referring to FIGS. 7 and 8, the nodes N10 and N11 are at 0 V before the voltage of the power supply Vcc rises. When the power supply Vcc rises after a high level $\overline{RAS}$ signal is applied, the output node N10 of the inverter 5a remains at 0 V. Meanwhile, the output node N11 of the inverter 5b is brought to a high level voltage, so that the stray capacitance C11 existing between the node N11 and the ground Vss is charged. Therefore, a charging current flows from the power supply Vcc.

Various peripheral circuits are provided in the dynamic RAM as shown in FIG. 2, each of which comprising, in most cases, circuits such as shown in FIG. 7. As described above, immediately after the power supply Vcc is turned on, charging currents for charging stray capacitances in these circuits flow in, causing a peak current $I_1$ at the time $t_2$ shown in FIG. 5.

Referring again to FIG. 7, the current $I_2$ of a constant value consumed after the time $t_2$ will be described. The current $I_2$ corresponds to the current $I_2$ from the power supply Vcc which is shown in FIG. 3.

Generally, the $\overline{RAS}$ signal has a voltage level called TTL (Transistor Transistor Logic) level. More specifically, the high level of the $\overline{RAS}$ signal is about 2.4 V when the power supply Vcc is 5 V. The transistor Q2 turns on in response to a high level $\overline{RAS}$ signal applied between the gate and the source thereof. Meanwhile, the transistor Q1 receives approximately $-2.6[= -(Vcc-2.4)]V$ between the gate and the source thereof, and turns on. Therefore, both transistors Q1 and Q2 turn on and a current flows from the power supply Vcc to the ground Vss. This current is included in the current $I_2$ shown in FIG. 5, which flows constantly. In addition, a current which will be described in the following is also included in the current $I_2$.

Figure 9:
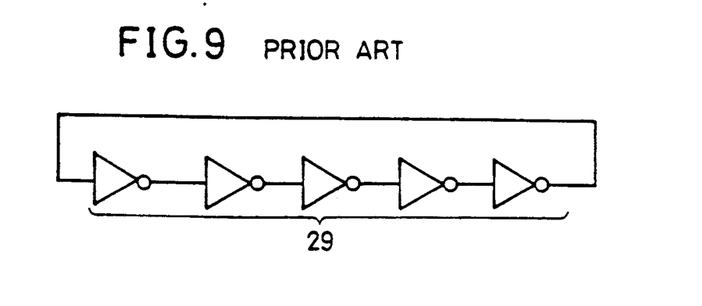
FIG. 9 is a schematic diagram showing a ring oscillator provided in the dynamic RAM.

FIG. 9 is a schematic diagram showing a ring oscillator provided for generating negative voltage in the dynamic RAM. Referring to FIG. 9, the ring oscillator comprises an odd-number of inverters 29 which is connected in series to form a ring. A pulsating current which fluctuates in several mega-hertz frequency flows into the ring oscillator from the power supply Vcc. Since this current is of high frequency, it seems as a direct current and is included in the current $I_2$ shown in FIG. 5.

On the other hand, the timing chart of the FIG. 6 shows the case in which the supply voltage Vcc starts to be applied to the dynamic RAM from the time $t_1$, while the $\overline{RAS}$ signal is low level. Since the supply voltage Vcc is applied to the RAM chip while the RAM chip is in the active state, the current Icc after the time $t_1$ is increased. At this time, since each node of circuits in the dynamic RAM has not been necessarily brought to a predetermined high or low level, excessive current Icc flows therein. As a result, after the current Icc reaches its big peak value of $I_3$ (several tens of mA) which is bigger than the value of $I_1$ at the time $t_3$, it is reduced to the value of $I_4$ (below 10 mA) which is considerably smaller than the value of $I_3$, and then stabilized. The value of $I_4$ is a current value necessary for operation in the active state, which is the same as that shown in FIG. 3.

A description is made of the reason for the inflow of the excessive current hereinafter.

Figure 10:
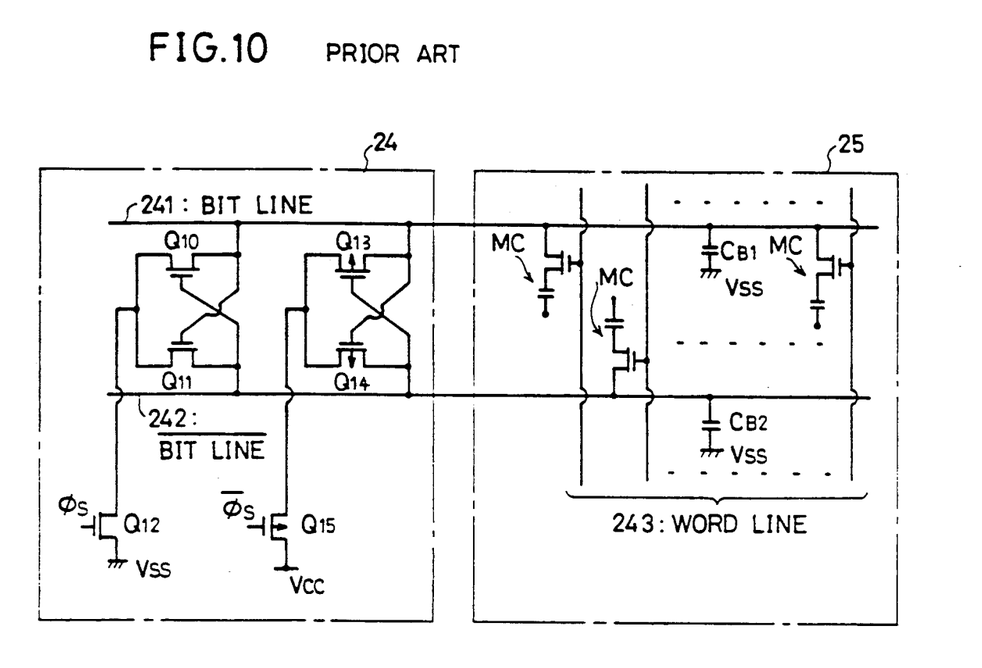
FIG. 10 is a schematic diagram showing portions of the sense amplifier and the memory array.

FIG. 10 is a schematic diagram showing an example of portions of the sense amplifier 24 and the memory array 25 of the dynamic RAM shown in FIG. 2. Referring to FIG. 10, the sense amplifier 24 comprises two latch circuits connected between a bit line 241 and a bitline/ 242. One latch circuit is constituted by N channel MOS transistors Q10 and Q11 and is connected to the ground Vss through an N channel MOS transistor Q12. The other circuit is constituted by P channel MOS transistors Q13 and Q14 and is connected to the power supply Vcc through a P channel MOS transistor Q15. The gates of the transistors Q12 and Q15 are connected such that they receive sense signals $\phi_s$ and $\overline{\phi}_s$ respectively, which signals are inverted from each other.

The memory array 25 is connected to the sense amplifier 24 through the bit lines 241 and 242. Memory cells MC each consisted of one N channel MOS transistor and a capacitor are connected between the bit line 241 or 242 and the word line 243. There are stray capacitances $C_{B1}$ and $C_{B2}$ between respective bit lines 241 and 242 and the ground Vss.

Figure 11:
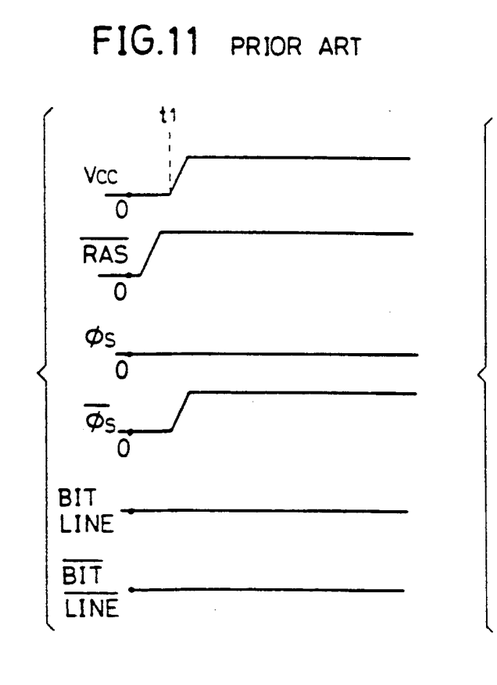
FIGS. 11 and 12 are timing charts for illustrating operations of the sense amplifier and the memory array shown in FIG. 10.

FIG. 11 is a timing chart showing the operation of a circuit shown in FIG. 10 when the power supply Vcc rises after a high level $\overline{RAS}$ signal is applied (in this case, it corresponds to the case shown in FIG. 5). Referring to FIGS. 10 and 11, the bit lines 241 and 242 are at 0 V before the power supply Vcc rises. When a high level $\overline{RAS}$ signal is applied and the power supply Vcc rises, a sense signal $\phi_s$ of 0 V is applied to the gate of the transistor Q12. Therefore, the transistor Q12 remains off. Meanwhile, a sense signal $\overline{\phi}_s$ which goes to a high level from 0 V simultaneously with the rise of the power supply Vcc is applied to the gate of the transistor Q15. Therefore, the transistor Q15 also remains off. Since both transistors Q12 and Q15 are off, the stray capacitances $C_{B1}$ and $C_{B2}$ are not charged. That is, the bit lines 241 and 242 are not charged by the power supply Vcc, and no current flows in from the power supply Vcc.

Figure 12:
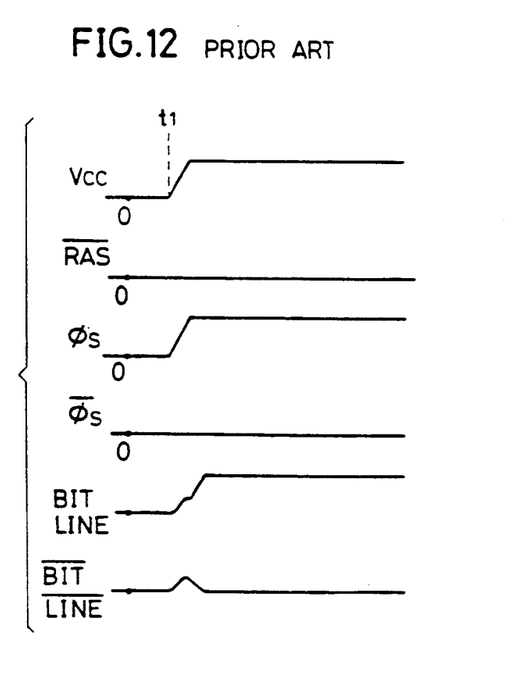

FIG. 12 shows a timing chart in which the power supply Vcc rises while the $\overline{RAS}$ signal remains at low level (corresponding to the case shown in FIG. 6. Referring to FIGS. 10 and 12, the bit lines 241 and 242 are at 0 V before the rise of the power supply Vcc. A sense signal $\phi_s$ which has risen to a high level from 0 V simultaneously with the rise of the power supply Vcc is applied to the gate of the transistor Q12. Therefore, the transistor Q12 turns on. Meanwhile, a sense signal $\overline{\phi_s}$ of 0 V is applied to the transistor Q15, and the transistor Q15 also turns on. Since both transistors Q12 and Q15 are turned on current flows into the bit lines 241 and 242 from the power supply Vcc through the transistor Q15 and to the ground Vss through the transistor Q12. The voltages at the bit lines 241 and 242 are slightly increased from 0 V due to this current. On this occasion, a through current flows from the power supply Vcc to the ground Vss through the transistor Q15, Q13 or Q14, Q10 or Q11, and Q12.

Thereafter, since the sense amplifier 24 comprises two latch circuits as described above, the bit line 241, for example, is brought to a high level and the bit line 242 is brought to a low level. Which of the two bit lines 241 and 242 is brought to the high level is determined by a slight imbalance between the stray capacitances $C_{B1}$ and $C_{B2}$ having approximately the same capacitance value. Since one of the two bit lines 241 and 242 is charged by the power supply Vcc, a charging current flows into the dynamic RAM from the power supply Vcc. Generally, one stray capacitance $C_{B1}$ or $C_{B2}$ has a value less than 0.4 pF. Therefore, in a case of 1 mega-bit dynamic RAM for example, 2048 stray capacitances are charged, with the total capacitance value being 819 pF ($=0.4$ pF$\times 2048$). A current for charging the total capacitance is included in the current $I_3$ shown in FIG. 6.

The current $I_3$ shown in FIG. 6 comprises the following current besides the above described through current and the charging current from the power supply Vcc. Referring again to FIG. 7, when the power supply Vcc rises with the $\overline{RAS}$ signal being low level, the output node N10 of the inverter 5a is brought to a high level voltage from 0 V. Therefore, the stray capacitance C10 existing between the node N10 and the ground Vss is charged by the power supply Vcc and a charging current flows in from the power supply Vcc. As described above, the dynamic RAM comprises a number of circuits such as shown in FIG. 7 and such charging currents are included in the current $I_3$ shown in FIG. 6.

Meanwhile, the constant current $I_4$ which flows after the time $t_3$ corresponds to the current $I_4$ of the timing chart shown in FIG. 3.

As described above, in the conventional dynamic RAM, the excessive current $I_3$ (for example 50 mA) from the power supply Vcc flows in when the power supply Vcc is turned on. Because of this excessive current $I_3$, power supply capacity could be insufficient, so that other circuits could not operate correctly or the line fuse could be blown. In addition, the heat produced by this excessive current could cause a malfunction of the dynamic RAM.

SUMMARY OF THE INVENTION

One object of the invention is to reduce excessive current flowing in a semiconductor memory device, when power is first turned on.

Another object is to reduce excessive current in a dynamic RAM, when power is first turned on.

Another object is to reduce excessive current in a dynamic RAM having first and second operating states, when power is fist turned on.

Yet another object is to reduce excessive current in a dynamic RAM having active and standby operating states, when power is first turned on.

Still another object is to reduce excessive current in a dynamic RAM having active and standby operating states, wherein the DRAM has a tendency to be in the active state, when power is first applied.

Another object of the invention is to improve the reliability of semiconductor memory devices.

Still another object is to reduce power supply requirements in a semiconductor memory device system.

Yet another object is to prevent damage to semiconductor memory devices as a result of excessive current flow therethrough when power is first applied.

Briefly stated, the present invention comprises a first control circuit responsive to an external control signal for controlling a semiconductor memory device to operate selectively in a first operating state and a second operating state which state consumes less current; a detector circuit for detecting an application of power to the memory device; a generating circuit responsive to the detector circuit for generating a pseudo-state signal defining the second operating state of the memory device; and a second control circuit responsive to the external control signal or said pseudo-state signal for operating the memory device in the second operating state.

In operation, a pseudo-state signal is generated immediately after the application of power. The memory device operates in the second operating state responsive to the pseudo-state signal, thereby reducing current consumption.

In a preferred embodiment, the present invention is applied to a dynamic random access memory (RAM). Therefore, the current consumed by the dynamic RAM after the application of power can be reduced.

In another preferred embodiment, a power on reset pulse generating circuit is applied as a circuit for generating the pseudo-state signal. Therefore, a pseudo-state-signal generating circuit can be readily obtained.

In another aspect, the present invention is a method for operating a semiconductor memory device comprising a first control circuit responsive to an external control signal for operating the memory device selectively in a first operating state and a second operating state which state consumes less current, comprising the steps of: detecting application of power to the memory device; generating a pseudo-state signal responsive to the application of power to the memory device, which signal defining the second operating state; and operating the memory device in the second operating: state responsive to the external control signal or to the pseudo-state signal.

In operation, the pseudo-state signal is generated immediately after the application of power. The memory device operates in the second operating state in response to the pseudo-state signal, thereby reducing current consumption.

In accordance with a preferred embodiment in this suspect, the method is applied to a dynamic RAM. Therefore, the current consumed by the DRAM after the application of power can be reduced.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 13:
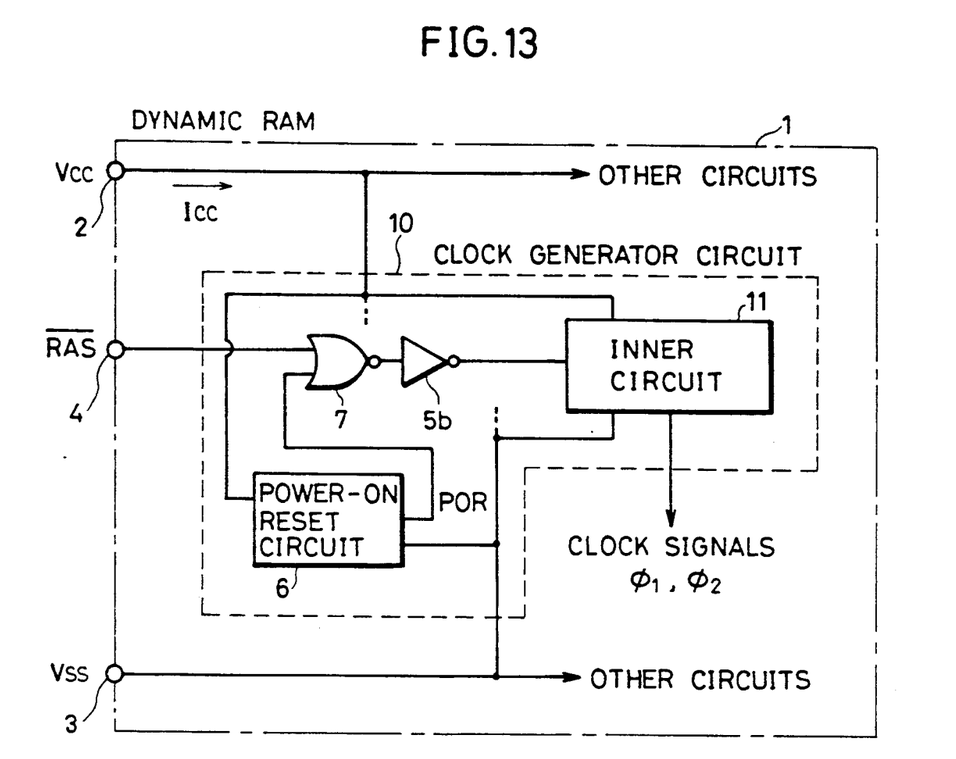
FIG. 13 is a schematic diagram showing a clock generator circuit of one embodiment of the present invention.

FIG. 13 is a schematic diagram showing one embodiment of a clock generator circuit of a dynamic RAM in accordance with the present invention.

Referring to FIG. 13, the clock generator circuit 10 comprises a buffer circuit connected to a $\overline{RAS}$ terminal 4 and an inner circuit 11 for outputting clock signals $\phi_1$ and $\phi_2$ in response to an output signal from the buffer circuit. The buffer circuit comprises an NOR gate 7 and an inverter 5b connected in series, and a power-on reset circuit 6. One input of the NOR gate 7 is connected to the $\overline{RAS}$ terminal 4 and the other input is connected to receive an output signal POR of the power-on reset circuit 6. The output of the NOR gate 7 is connected to the input of the inverter 5b. The output of the inverter 5b is connected to the inner circuit 11. Since the other circuits except for the buffer circuit are the same as the conventional circuit shown in FIG. 4, a description thereof is omitted.

Next, a description is made of operation of the circuit.

Figure 14:
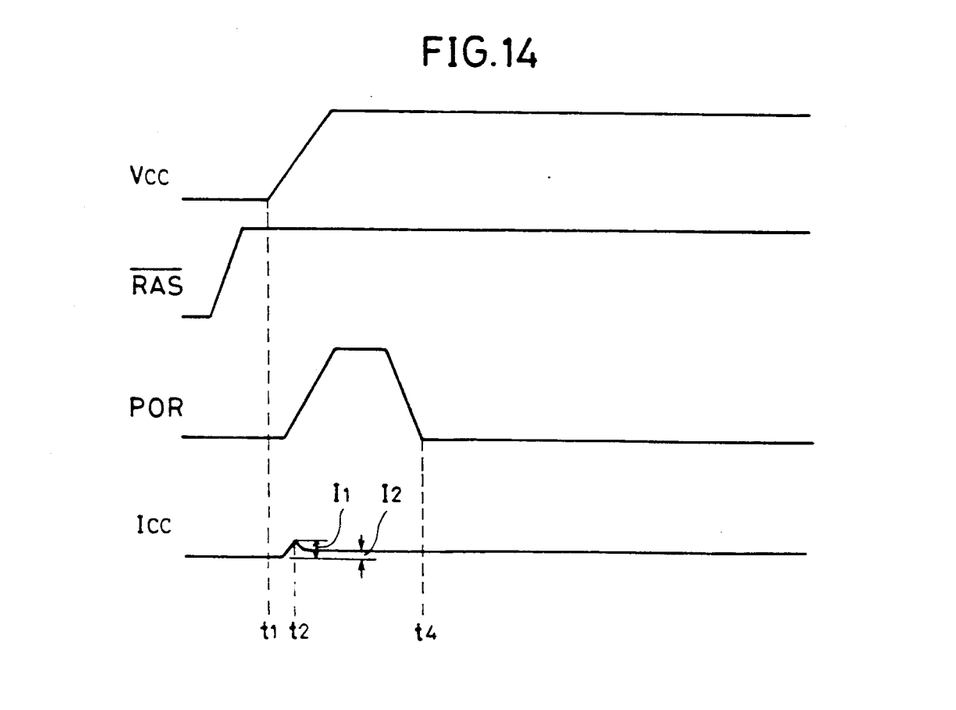
FIGS. 14 and 15 are timing charts for explaining operation of the dynamic RAM of FIG. 13.
Figure 15:
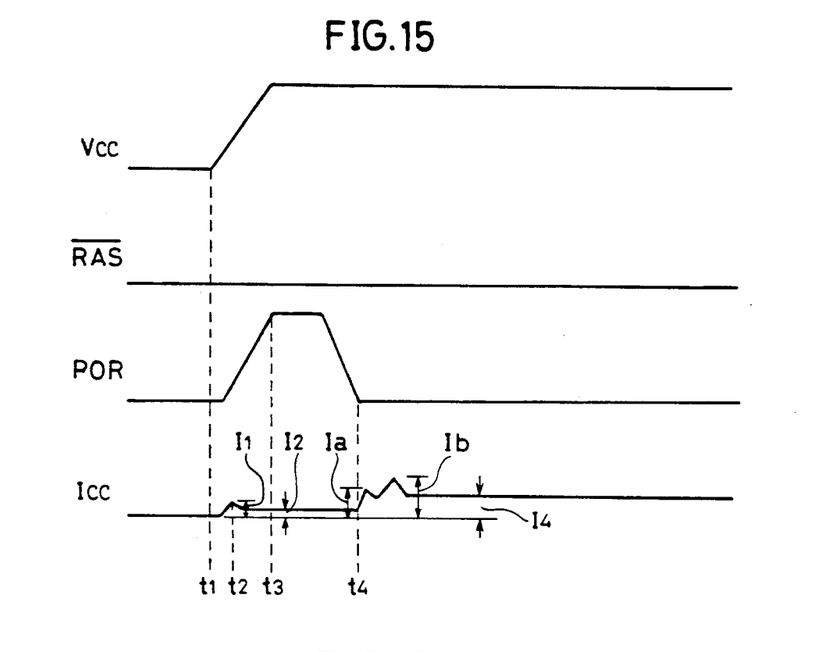

FIGS. 14 and 15 are timing charts showing a change of signals for explaining operation of the dynamic RAM of FIG. 13. Referring to FIGS. 14 and 15, a supply voltage Vcc starts to be applied to the terminal 2 from a time $t_1$ and the applied voltage rises to a predetermined voltage level. When the applied voltage reaches the predetermined voltage, the voltage will not change thereafter. After the supply voltage Vcc is applied, a one-shot pulse signal POR having a predetermined pulse width is outputted from the power-on reset circuit 6.

FIG. 14 shows the case in which a high-level $\overline{RAS}$ signal is applied to the terminal 4 before the time $t_1$. The $\overline{RAS}$ signal is applied to the inner circuit 11 through the NOR gate 7. The $\overline{RAS}$ signal and the one-shot pulse POR are applied to the NOR gate 7, but in this case, the output signal of the NOR gate 7 is not affected by this pulse POR. Therefore, like in the case of FIG. 5, the supply voltage Vcc is applied while the RAM chip 1 is in the standby state. As a result, the current Icc flowing from the power supply Vcc to the dynamic RAM reaches its small peak value of $I_1$ (several mA) at the $t_2$, the value is reduced to $I_2$ which is smaller than $I_1$, and then stabilized. The value of $I_2$ is the current value necessary for operation in the standby state.

On the other hand, the timing chart of FIG. 15 shows the case in which a supply voltage Vcc starts to be applied to the dynamic RAM from the time $t_1$, while the $\overline{RAS}$ signal is low level. When the dynamic RAM is in the active state, the supply voltage Vcc starts to be applied from the time $t_1$ A one-shot pulse POR is generated immediately after the supply voltage Vcc is applied and it is applied to the other input of NOR gate 7. The dynamic RAM is brought to the standby state during a period of time of a pulse width (until a time $t_4$) for a short time by this pulse POR. Therefore, during this short standby period, after the current Icc flowing into the dynamic RAM reaches its small peak value of $I_1$ (several mA) at the time $t_2$, it is reduced to the value of $I_2$ which is smaller than $I_1$, and then stabilized. Next, since the pulse POR changes to low level at the time $t_4$, the dynamic RAM is brought to the active state. When the dynamic RAM becomes the active state, the current Icc of a peak values of $I_a$ and $I_b$ which are considerably smaller than the current value of $I_3$ in FIG. 6 flows in and the current Icc is reduced to the value of $I_4$ which is smaller than $I_a$ and $I_b$, and then stabilized. The value of $I_4$ is a current value necessary for operation in the active state.

As described above, since the dynamic RAM is brought to the active state after it is brought to the standby state for a short time by the one-shot pulse POR, the inflow of the excessive current $I_3$ shown in FIG. 6 can be prevented.

Figure 16:
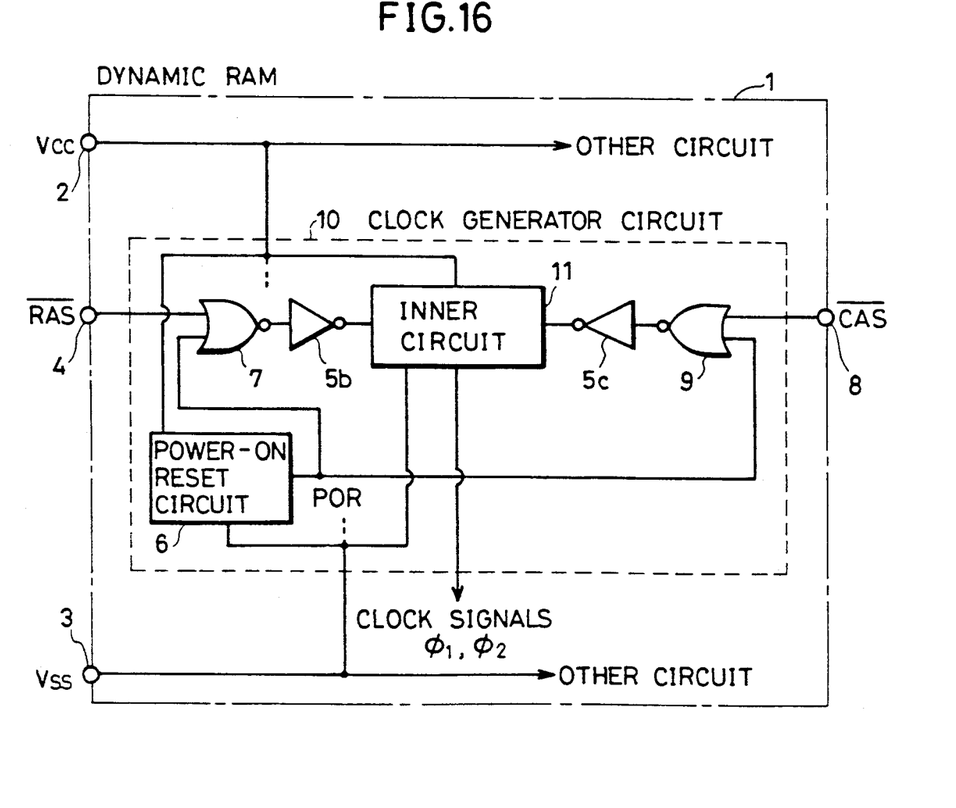
FIG. 16 is a schematic diagram showing a clock generator circuit of another embodiment of the present invention.

FIG. 16 is a schematic diagram showing another embodiment of the clock generator circuit of a dynamic RAM in accordance with the present invention.

Referring to FIG. 16, as compared with the circuit diagram of FIG. 13, the clock generator circuit in FIG. 16 further comprises an NOR gate 9 having its one input connected to a $\overline{CAS}$ terminal 8 and an inverter 5c connected in series. The other input of the NOR gate 9 is connected to a power-on reset circuit 6. The output of the NOR gate 9 is connected to an inner circuit 11 through the inverter 5c. Since the other circuit portions are the same as those of the clock generator circuit of FIG. 13, a description thereof is omitted.

In operation, like the circuit controlled by the above described $\overline{RAS}$ signal, the circuit controlled by the $\overline{CAS}$ signal has a decrease in the inflow of an excessive current for a moment immediately after the supply voltage Vcc is applied.

Figure 17:
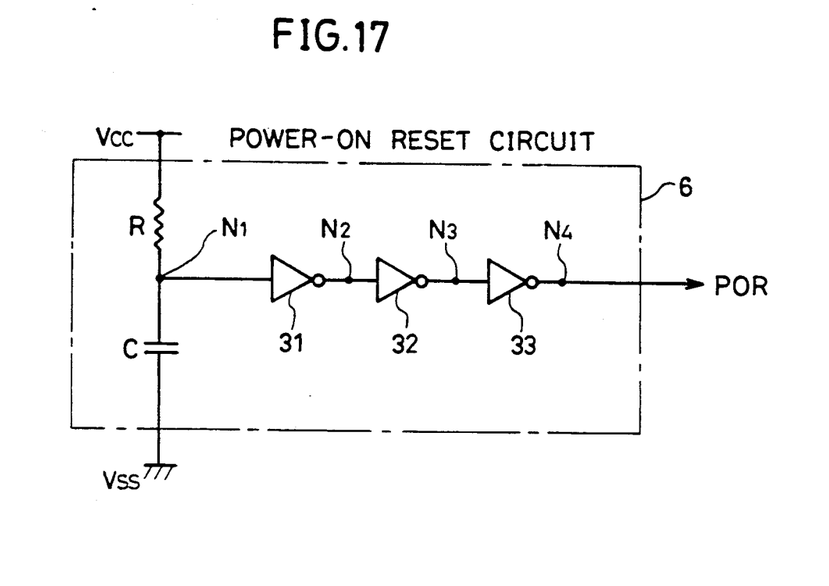
FIG. 17 is a schematic diagram showing one example of the clock generator circuit shown in FIG. 13 or 16.

FIG. 17 is a schematic diagram showing one example of a power-on reset circuit employed in the clock generator circuit in accordance with the present invention shown in FIGS. 13 and 16.

Referring to FIG. 17, the power-on reset circuit comprises a resistor R and a capacitor C connected in series between a power supply Vcc and the ground Vss and three inverters 31, 32 and 33 connected in series to an intersecting point of the resistor R and the capacitor C. A one-shot pulse POR is outputted from the inverter 33 of the last stage. A resistor value "R" of the resistor R and a capacitance value "C" of the capacitor C are selected so that the product of both values (that is time constant "RC") may be bigger than a rise, time of power supply Vcc. Nodes N1, N2 and N3 represent input points of the inverter 31, 32 and 33, respectively. A node N4 represents an output point of the inverter 33.

Figure 18:
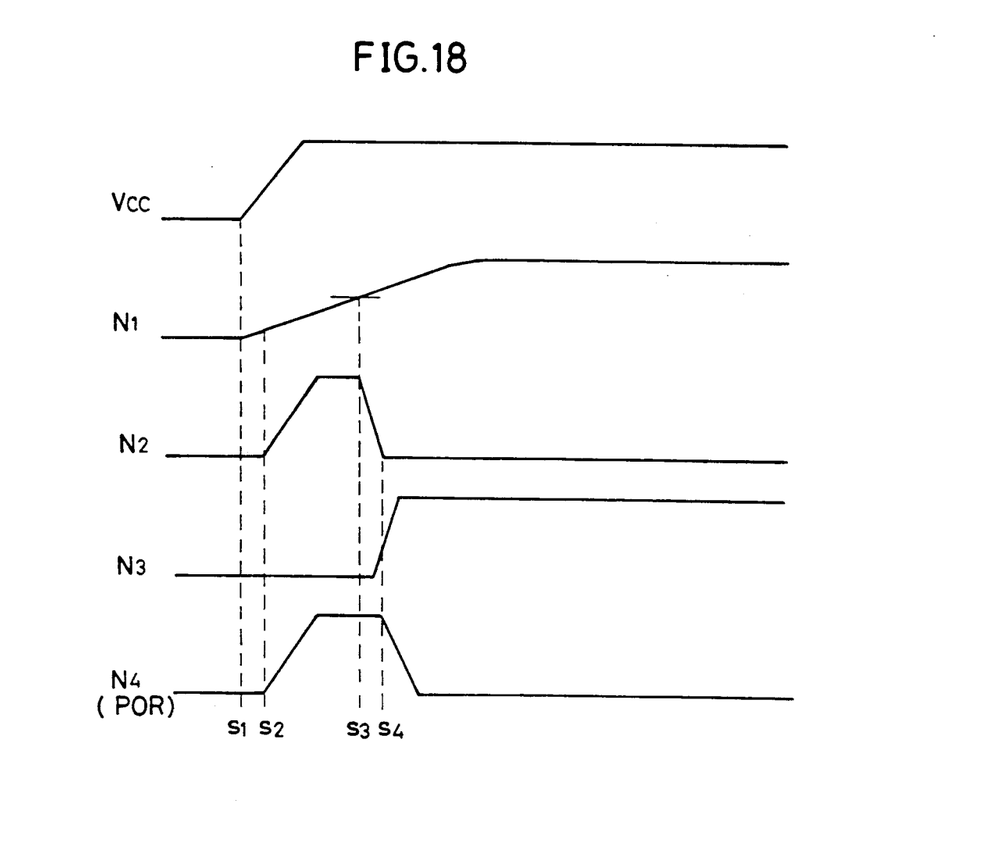
FIG. 18 is a timing chart for explaining operation of the clock generator circuit of FIG. 17.
Figure 19A:
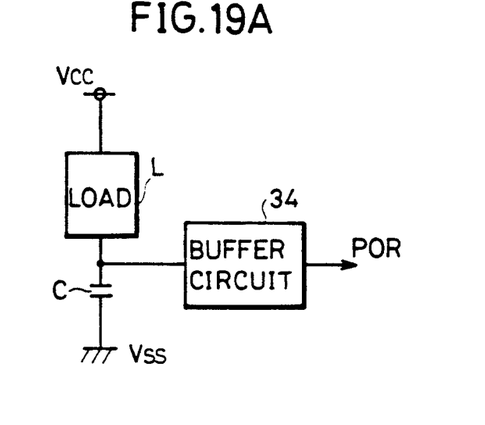
FIGS. 19A to 19D are schematic diagrams showing preferred embodiments of the power on reset circuit applied to the clock generator circuit shown in FIG. 13 or 16.
Figure 19B:
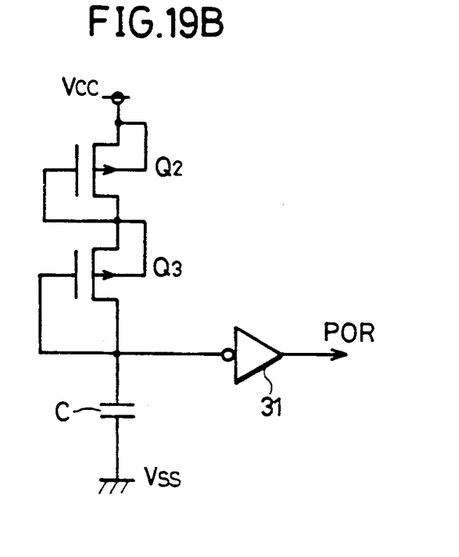
Figure 19C:
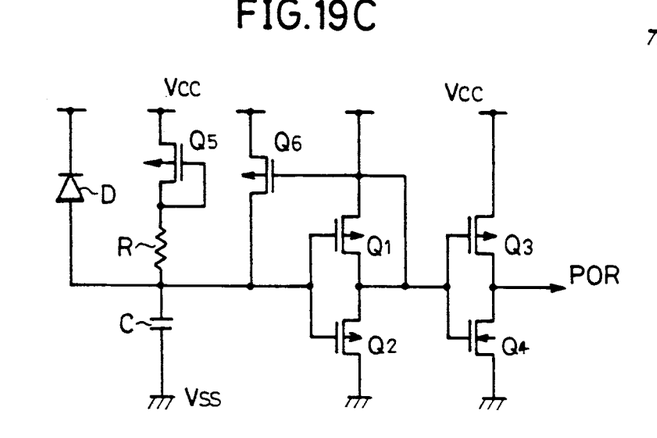
Figure 19D:
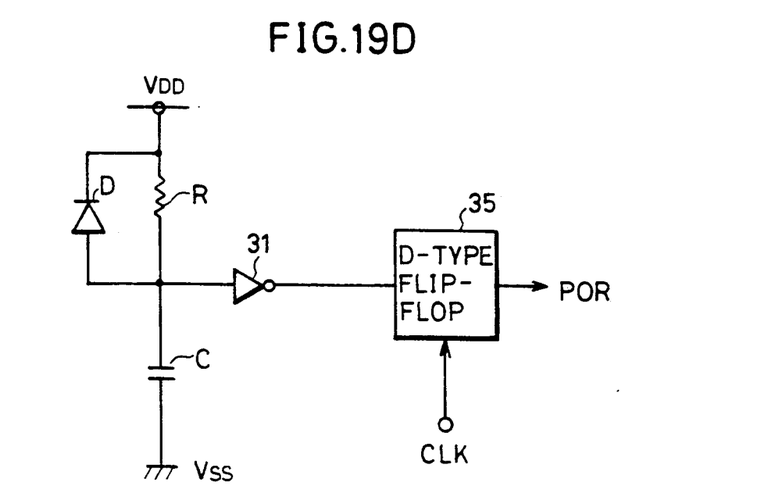

FIG. 18 is a timing chart for explaining operation of the power-on reset circuit of FIG. 17. Referring to FIG. 18, a description is made of operation of the power-on reset circuit of FIG. 17.

At the time s1, a voltage of the power supply Vcc starts to increase from 0 V to a voltage value of Vcc. A voltage of the node N1 also starts to increase in accordance with the time constant "RC" The time constant "RC" is bigger than a rise time of the power supply Vcc, the node N1 is not immediately charged and its voltage is at low level during a short period from the time s1 to s2. A voltage of the node N2 starts to increase from the time s2 and it is brought to a high-level constant voltage. A voltage of the node N3 is at low level during this period. A voltage of the node N4 starts to increase from the time s2 and it is brought to a high-level constant voltage. A voltage of the node N1 continuing to increase exceeds a threshold voltage of the inverter 31 (approximately ½ Vcc) at the time s3. Since the inverter 31 receives a high-level input voltage after the time s3, a voltage of the node N2 starts to decrease. A voltage of the node N3 starts to increase. As a result, a voltage of the node N4 starts to decrease from the time s4. The one-shot pulse POR can be obtained as described above from the node N4 after the power supply Vcc is turned on.

FIGS. 19A to 19D are schematic diagrams showing other preferred examples of the power on reset circuit applied to the clock generator circuit shown in FIG. 13 or 16.

Although the embodiment of the present invention employing the clock generator circuit of a dynamic RAM as one example was described in the foregoing, the present invention is applicable to a static RAM and the same effect can be brought about. In the case in which the present invention is applied to the static RAM, the power-on reset circuit 6 and the NOR gate 7 are provided in a circuit connected to a $\overline{CS}$ (Chip Select) terminal instead of the $\overline{RAS}$ terminal 4.

As described above, the semiconductor memory device to which the present invention is applied comprises a circuit for detecting an application of power to the memory device and a circuit for generating a pseudo-state signal in response to the detector circuit, whereby the device is temporarily brought to the standby state when the power supply is turned on for a first time. Therefore, the excessive current which flows when the power is turned on can be reduced. In addition, the dynamic RAM to which the present invention is applied comprises a circuit for detecting an application of power to the memory device, and a circuit for generating a pseudo-static signal in response to the detector circuit, whereby the device is temporarily brought to the standby state when the power supply is turned on for the first time. Therefore, the excessive current which flows when the power is turned on can be reduced. Meanwhile, since the shortage of the supply capacity due to the excessive current can be prevented, the semiconductor memory device operates normally, thereby improving reliability. In addition, the damages of the semiconductor memory device due to the excessive current can be prevented. The power supply requirement of the semiconductor memory device can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device operative in a first operating state and a second operating state and requiring an initial surge current upon initial power application thereto that is higher than a steady-state operating current requirement of said semiconductor memory device, wherein said memory device consumes more current in said first operating state than in said second operating state, reading and writing operations of said memory device being inhibited in said second operating state, said semiconductor memory device comprising:
   at least one memory cell for storing data
   first control means responsive to an external control signal for controlling said memory device to operate selectively in said first and second operating states;
   detector mans for detecting an application of power to said memory device;
   generating means responsive to said detector means for generating a power-on reset pulse signal defining said second operating state of said memory device for a predetermined time period initiated upon said detector means detecting application of power to said memory device; and
   second control means responsive to the external control signal and to said power-on reset pulse signal for selectively operating said memory device in said first and second operating states whereby said memory device is operated in said second operating state both in response to application of power thereto and in response to said external control signal to reduce an initial current requirement of said memory upon initial power application thereto.

2. A semiconductor memory device according to claim 1, wherein said first and second control means comprise one control means.

3. A semiconductor memory device according to claim 2, wherein said second control means comprises a NOR device means having at least two inputs, with said two inputs connected to receive the external control signal and the power-on reset signal.

4. A semiconductor memory device according to claim 1, wherein said external control signal comprises at least one of a row address strobe signal and a column address strobe signal.

5. A semiconductor memory device according to claim 1, wherein a pulse width of said power-on reset pulse is equal to said predetermined time period.

6. A semiconductor memory device according to claim 1 wherein said generating means includes means for controlling a duration of said power-on reset pulse to be equal to said predetermined time period.

7. A semiconductor memory device according to claim 1 wherein said generating means includes timing means for controlling a duration of said power-on reset pulse to be equal to said predetermined time period, said timing means including a combination of a load device and a capacitor a charging time constant characteristic of which is used to control said pulse duration.

8. A semiconductor memory device according to claim 7 wherein a time constant of said combination of said load device and said capacitor is greater than a rise time of said power applied to said memory device.

9. A semiconductor memory device according to claim 7 wherein said load device comprises a field effect transistor (FET).

10. A semiconductor memory device according to claim 7 wherein said load device comprises a field effect transistor (FET) connected in series with said capacitor between first and second voltage potentials.

11. A semiconductor memory device according to claim 1 further comprising a semiconductor substrate wherein said memory cell, said generating means and said first and second control means are all formed on said semiconductor substrate.

12. A dynamic random access memory device (DRAM) operative in a first operating state and a second operating state and requiring an initial surge current upon initial power application thereto that is higher than a steady-state operating current requirement of said semiconductor memory device, wherein said memory device consumes more current in said first operating state than in said second operating state, reading and writing operations of said memory device being inhibited in said second operating state, said dynamic random access memory device comprising:

at least one memory cell for storing data;

first control means responsive to an external control signal for controlling said memory device to operate selectively in said first and second operating states;

detector means for detecting an application of power to said memory device;

generating means responsive to said detector means for generating a power-on reset pulse signal defining said second operating state of said memory device for a predetermined time period initiated upon said detector means detecting application of power to said memory device; and second control means responsive to the external control signal and to said power-on reset pulse signal for selectively operating said memory device in said first and second operating states whereby said memory device is operated in said second operating state both in response to application of power thereto and in response to said external control signal to reduce an initial current requirement of said memory upon initial power application thereto.

13. A dynamic random access memory device according to claim 12, wherein said first operating state comprises an active operating state, and said second operating state comprises a standby operating state.

14. A dynamic random access memory device according to claim 13, wherein said memory device has a tendency to be in said active operating state when power is applied for a first time.

15. A dynamic random access memory device according to claim 12 wherein a pulse width of said power-on reset pulse is equal to said predetermined time period.

16. A dynamic random access memory device according to claim 12 wherein said generating means includes means for controlling a duration of said power-on reset pulse to be equal to said predetermined time period.

17. A dynamic random access memory device according to claim 12 wherein said generating means includes timing means for controlling a duration of said power-on reset pulse to be equal to said predetermined time period, said timing means including a combination of a load device and a capacitor a charging time constant characteristic of which is used to control said pulse duration.

18. A dynamic random access memory device according to claim 17 wherein a time constant of said combination of said load device and said capacitor is greater than a rise time of said power applied to said memory device.

19. A dynamic random access memory device according to claim 17 wherein said load device comprises a field effect transistor (FET).

20. A dynamic random access memory device according to claim 17 wherein said load device comprises a field effect transistor (FET) connected in series with said capacitor between first and second voltage potentials.

21. A dynamic random access memory device according to claim 12 further comprising a semiconductor substrate wherein said memory cell, said generating means and said first and second control means are all formed on said semiconductor substrate.

22. A method for operating a semiconductor memory device operative in a first operating state and a second operating state to reduce an initial current requirement of said memory upon initial power application thereto, wherein said device consumes more current in said first operating state than in said second operating state and requires an initial surge current upon initial power application thereto that is higher than a steady-state operating current requirement of said semiconductor memory device, reading and writing operations of said memory device being inhibited in said second operating state, said semiconductor device comprising at least one memory cell for storing data; and first control means responsive to an external signal for controlling said memory device to operate selectively in said first and second operating states, said method comprising the steps of:

detecting an application of power to said memory device;

generating a power-on reset pulse signal defining said second operating state of said memory device in response to the application of power to said memory device; and automatically operating said memory device in said second operating state for a predetermined time period responsive to said power-on reset pulse signal.

23. A method of operating a semiconductor memory device according to claim 22 wherein said power-on reset pulse generated by said generating step has a pulse width equal to said predetermined time period.

24. A method of operating a semiconductor memory device according to claim 22 wherein said generating step includes a step of controlling a duration of said power-on reset pulse to be equal to said predetermined time period.

25. A method of operating a semiconductor memory device according to claim 22 wherein said generating step includes the steps of charging a capacitor through a load device, detecting a predetermined voltage of said capacitor, and, in response, controlling a duration of said power-on reset pulse to be equal to said predetermine time period.

26. A method of operating a semiconductor memory device according to claim 25 including a step of selecting a time constant of said combination of said load device and said capacitor to be greater than a rise time of said power applied to said memory device.

27. A method for operating a dynamic random access memory device (CRAM) operative in a first operating state and a second operating state to reduce an initial current requirement of said memory upon initial power application thereto, wherein said device consumes more current in said first operating state than in said second operating state and requires an initial surge current upon initial power application thereto that is higher than a steady-state operating current requirement of said semiconductor memory device, reading and writing operations of said memory device being inhibited in said second operating state, said dynamic random access memory device comprising at least one memory cell for storing data; and first control means responsive to an external control signal for controlling said memory device to operate selectively in said first and second operating states, said method comprising the steps of:
 detecting an application of power to said memory device;
 generating a power-on reset pulse signal defining said second operating state of said memory device in response to the application of power to said memory device; and
 automatically operating said memory device in said second operating state for a predetermined time period responsive to said power-on reset pulse signal.

28. A method of operating a dynamic random access memory device according to claim 27 wherein said power-on reset pulse generated by said generating step has a pulse width equal to said predetermined time period.

29. A method of operating a dynamic random access memory device according to claim 27 wherein said generating step includes a step of controlling a duration of said power-on reset pulse to be equal to said predetermined time period.

30. A method of operating a dynamic random access memory device according to claim 27 wherein said generating step includes the steps of charging a capacitor through a load device, detecting a predetermined voltage of said capacitor, and, in response, controlling a duration of said power-on reset pulse to be equal to said predetermined time period.

31. A method of operating a dynamic random access memory device according to claim 30 including a step of selecting a time constant of said combination of said load device and said capacitor to be greater than a rise time of said power applied to said memory device.

32. A semiconductor memory device having a memory cell for storing data and receiving an external row address strobe signal, said semiconductor memory device requiring an initial surge current upon initial power application thereto that is higher than an steady-state operating current requirement of said semiconductor memory device, said semiconductor memory device comprising:
 a NOR logic circuit having first and second input terminals and an output terminal, said first input terminal receiving said external row address strobe signal, said second input terminal receiving a control signal, and said output terminal supplying an internal row address strobe signal for controlling access to said memory cell; and
 a signal generator circuit having a load device and a capacitor coupled in series with each other between a first potential source and a second potential source, and an inverter circuit having an input terminal coupled to a node between said load device and said capacitor and an output terminal providing said control signal to said second input terminal of said NOR logic circuit whereby an operation of said load device and said capacitor defines a time period defining a duration of said control signal to reduce the initial surge current requirement of said semiconductor memory device.

33. A semiconductor memory device to claim 32 wherein said load means comprises a field effect transistor (FET).

34. A semiconductor memory device according to claim 32 wherein a time constant of said combination of said load device and said capacitor is greater than rise time of said power applied to said memory device.

35. A semiconductor memory device operative in an active operating state and a standby operating state and requiring an initial surge current upon initial power application thereto that is higher than a steady-state operating current requirement of said semiconductor memory device, wherein said memory device receives a control signal for controlling said memory device to operate selectively in said active and standby operating states, reading and writing operations of said memory device being inhibited in said standby operating state, said semiconductor memory device comprising:
 generating means for generating a power-on reset pulse signal for controlling said memory device to operate in said standby operating state for a predetermined period of time whenever a predetermined power is applied to said memory device; and
 control means for (1) operating said memory device in said standby operating state for said predetermined period of time responsive to said power-on reset pulse signal and then (2) operating said memory device in one of said operating states responsive to said control signal to reduce the initial power supply requirement of said memory device.

36. A semiconductor memory device according to claim 35 wherein a pulse width of said power-on reset pulse is equal to said predetermined time period.

37. A semiconductor memory device according to claim 35 wherein said generating means includes mean for controlling a duration of said power-on reset pulse to be equal to said predetermined time period.

38. A semiconductor memory device according to claim 35 wherein said generating means includes timing means for controlling a duration of said power-on reset pulse to be equal to said predetermined time period, said timing means including a combination of a load device and a capacitor a charging time constant characteristic of which is used to control said pulse duration.

39. A semiconductor memory device according to claim 38 wherein said load device comprises a field effect transistor (FET).

40. A semiconductor memory device according to claim 38 wherein said load device comprises a field effect transistor (FET) connected in series with said capacitor between first and second voltage potentials.

41. A semiconductor memory device according to claim 38 wherein a time constant of said combination of said load device and said capacitor is greater than a rise time of said power applied to said memory device.

42. A semiconductor memory device according to claim 35 further comprising a semiconductor substrate wherein said memory cell, said generating means and said first and second control means are all formed on said semiconductor substrate.

43. A semiconductor memory device according to claim 35 wherein said predetermined time period is selected to suppress an initial current surge requirement of said semiconductor memory device upon said initial application of power thereto.

44. A method for operating a semiconductor memory device operative in an active operating state and a standby operating state to reduce an initial power supply requirement of said memory device, wherein said memory device receives a control signal for controlling said memory device to operate selectively in said active and standby operating states, reading and writing operations of said memory device being inhibited in said standby operating state and requires an initial surge current upon initial power application thereto that is higher than a steady-state operating current requirement of said semiconductor memory device, said method comprising the steps of:
(a) detecting application of a predetermined power to said memory device;
(b) generating a power-on reset pulse signal in response to step (a) for controlling said memory device to operate in said standby operating state for a predetermined period of time; and
(c) operating said memory device in said standby operating state in response to said power-on reset pulse signal for said predetermined period of time and operating said memory device in one of said operating states responsive to said control signal subsequent to expiration of said predetermined period of time to reduce the initial power supply current requirement of said memory device.

45. A method of operating a semiconductor memory device according to claim 44 wherein said power-on reset pulse generated by said generating step has a pulse width equal to said predetermined time period.

46. A method of operating a semiconductor memory device in according to claim 44 wherein said generating step includes a step of controlling a duration of said power-on reset pulse to be equal to said predetermined time period.

47. A method of operating a semiconductor memory device according to claim 24 wherein said generating step includes the steps of charging a capacitor through a load device, detecting a predetermined voltage of said capacitor, and, in response, controlling a duration of said power-on reset pulse to be equal to said predetermined time period.

48. A method of operating a semiconductor memory device according to claim 47 including a step of selecting a time constant of said combination of said load device and said capacitor to be greater than a rise time of said power applied to said memory device.

49. A method for operating a semiconductor memory device operative in an active operating state and a standby operating state to reduce an initial power supply current requirement of said memory device, wherein said memory device receives a control signal for controlling said memory device to operate selectively in said active and standby operating states, reading and writing operations of said memory device being inhibited in said standby operating state and requires an initial surge current upon initial power application thereto that is higher than a steady-state operating current requirement of said semiconductor memory device, said method comprising the steps of:
(a) detecting application of a predetermined power to said memory device;
(b) generating a power-on reset pulse signal in response to step (a) for controlling said memory device to operate in said standby operating state for a predetermined period of time; and
(c) inhibiting operation of said memory device in said active operating state for said predetermined period of time in response to said power-on reset pulse signal to reduce the initial power supply current requirement of said memory device.

50. A method of operating a semiconductor memory device according to claim 49 wherein said power-on reset pulse generated by said generating step has a pulse width equal to said predetermined time period.

51. A method of operating a semiconductor memory device in according to claim 49 wherein said generating step includes a step of controlling a duration of said power-on reset pulse to be equal to said predetermined time period.

52. A method of operating a semiconductor memory device according to claim 49 wherein said generating step includes the steps of charging a capacitor through a load device, detecting a predetermined voltage of said capacitor, and, in response, controlling a duration of said power-on reset pulse to be equal to said predetermined time period.

53. A method of operating a semiconductor memory device according to claim 52 including a step of selecting a time constant of said combination of said load device and said capacitor to be greater than a rise time of said power applied to said memory device.

54. A semiconductor memory device having a plurality of memory cells, comprising:
a semiconductor substrate;
an internal circuit means including clock generating means, row and column addressing means and sense amplifying means;
a control signal terminal receiving an external control signal and formed on said semiconductor substrate;
a power supply terminal receiving a power supply and formed on said substrate;
a power-on reset signal generating means formed on said semiconductor substrate and connected to said power supply terminal for generating a power-on reset pulse having a predetermined width when said power supply is applied to said power supply terminal; and
a control means formed on said semiconductor substrate and connected to said control signal terminal and the output node of said generating means for supplying an internal control signal formed by combining said external control signal and power-on reset pulse for controlling said internal circuit means.

55. A semiconductor memory device according to claim 54, wherein said external control signal is an external Row Address Strobe signal, and said control means supplies an internal Row Address Strobe Signal formed by said external Row Address Signal, and selectively supplies (i) a predetermined potential during said power-on reset pulse and (ii) an internal Row Address Strobe in the absence of said power on reset pulse.

56. A semiconductor memory device according to claim 54, wherein said external control signal is a Row Address Strobe signal and said control means selectively supplies (i) a predetermined potential during said power-on reset pulse and (ii) an internal Row Address Strobe signal in the absence of said power-on reset pulse.

* * * * *